United States Patent
Wagner et al.

(10) Patent No.: US 9,643,840 B2
(45) Date of Patent: May 9, 2017

(54) DIELECTRIC POLYURETHANE FILM

(71) Applicant: Bayer MaterialScience AG, Monheim am Rhein (DE)

(72) Inventors: Joachim Wagner, Köln (DE); Jens Krause, Leverkusen (DE); Dennis Hönel, Zülpich-Wichterich (DE)

(73) Assignee: Covestro Deutschland AG, Leverkusen (DE)

( * ) Notice: Subject to any disclaimer, the term of this patent is extended or adjusted under 35 U.S.C. 154(b) by 106 days.

(21) Appl. No.: 14/410,178

(22) PCT Filed: Jun. 24, 2013

(86) PCT No.: PCT/EP2013/063170
§ 371 (c)(1),
(2) Date: Dec. 22, 2014

(87) PCT Pub. No.: WO2014/001272
PCT Pub. Date: Jan. 3, 2014

(65) Prior Publication Data
US 2015/0321908 A1 Nov. 12, 2015

(30) Foreign Application Priority Data
Jun. 27, 2012 (EP) .................................... 12173770

(51) Int. Cl.
*B81C 1/00* (2006.01)
*B81B 3/00* (2006.01)
(Continued)

(52) U.S. Cl.
CPC .......... *B81C 1/0038* (2013.01); *B29C 39/003* (2013.01); *B32B 27/40* (2013.01);
(Continued)

(58) Field of Classification Search
CPC . B29C 39/003; B29C 39/006; B29K 2075/00; B29K 2995/0006;
(Continued)

(56) References Cited

U.S. PATENT DOCUMENTS 4,209,593 A * 6/1980 Khanna .............. C08G 18/2805
521/163
5,158,922 A 10/1992 Hinney et al.
(Continued)

FOREIGN PATENT DOCUMENTS

DE 102007005960 A1 8/2008
DE 102007059858 A1 6/2009
(Continued)

OTHER PUBLICATIONS

International Search Report for PCT/EP2013/063170 mailed Sep. 30, 2013.

*Primary Examiner* — Thao T Tran
(74) *Attorney, Agent, or Firm* — Drinker Biddle & Reath LLP

(57) ABSTRACT

The present invention relates to a process for producing a dielectric polyurethane film, in which at least the following steps are performed continuously: I) a mixture comprising: a) a compound containing isocyanate groups and having a content of isocyanate groups of >10% by weight and ≤50% by weight, b) a compound containing isocyanate-reactive groups and having an OH number of ≥20 and ≤150, at least one solvent having a vapor pressure at 20° C. of >0.1 mbar and <200 mbar, at least one wetting additive, is produced, where the sum of the number-average functionalities of isocyanate groups and of isocyanate-reactive groups in the compounds a) and b) is ≥2.6 and ≤6, II) immediately after production thereof, the mixture is applied to a carrier in the form of a wet film, III) the wet film is cured to form the polyurethane film and IV) the polyurethane film is separated
(Continued)

Schematic structure of a continuous film-coating system for the roll-to-roll method from the carrier. The invention further provides a dielectric polyurethane film obtainable by the process according to the invention, a process for producing an electromechanical transducer, and an electromechanical transducer obtainable by this process.

17 Claims, 1 Drawing Sheet

(51) Int. Cl.
*B29C 39/00* (2006.01)
*H01B 3/30* (2006.01)
*B32B 27/40* (2006.01)
*C08J 5/18* (2006.01)
*C08G 18/78* (2006.01)
*C08G 18/42* (2006.01)
*C08G 18/44* (2006.01)
*H01L 41/45* (2013.01)
*H01L 41/193* (2006.01)
*B29K 75/00* (2006.01)
*B29L 7/00* (2006.01)

(52) U.S. Cl.
CPC ........ *B81B 3/0021* (2013.01); *C08G 18/4211* (2013.01); *C08G 18/44* (2013.01); *C08G 18/7831* (2013.01); *C08J 5/18* (2013.01); *H01B 3/302* (2013.01); *H01L 41/193* (2013.01); *H01L 41/45* (2013.01); *B29K 2075/00* (2013.01); *B29K 2995/0006* (2013.01); *B29L 2007/008* (2013.01); *B32B 2250/03* (2013.01); *B32B 2307/204* (2013.01); *B32B 2457/00* (2013.01); *C08J 2375/04* (2013.01); *Y10T 29/43* (2015.01); *Y10T 428/31551* (2015.04)

(58) Field of Classification Search
CPC ........... B29L 2007/008; B32B 2250/03; B32B 2307/204; B32B 2457/00; B32B 27/40; B81B 3/0021; B81C 1/0038; C08G 18/4211; C08G 18/44; C08G 18/7831; H01B 3/302; H01L 41/193; H01L 41/45; Y10T 29/43; Y10T 428/31551; Y10T 428/31565; Y10T 428/31591
USPC ..... 428/423.1, 423.7, 425.1; 427/372.2, 379, 427/385.5, 395
See application file for complete search history.

(56) References Cited

U.S. PATENT DOCUMENTS

| | | | |
|---|---|---|---|
| 2006/0025493 A1* | 2/2006 | Simpson | C08G 18/4837 521/155 |
| 2008/0188615 A1 | 8/2008 | Jenninger et al. | |
| 2009/0312450 A1* | 12/2009 | Martin | C07C 235/08 521/157 |
| 2010/0259133 A1 | 10/2010 | Jenninger et al. | |
| 2011/0133598 A1 | 6/2011 | Jenninger et al. | |
| 2011/0198852 A1 | 8/2011 | Jenninger et al. | |
| 2011/0298335 A1 | 12/2011 | Jenninger et al. | |
| 2012/0028177 A1* | 2/2012 | Cote | G03G 5/0589 430/56 |
| 2012/0194039 A1 | 8/2012 | Jenninger et al. | |

FOREIGN PATENT DOCUMENTS

| | | |
|---|---|---|
| EP | 0654302 A1 | 5/1995 |
| EP | 1919071 A2 | 5/2008 |
| EP | 2280034 A1 | 2/2011 |
| EP | 2330649 A1 | 6/2011 |
| WO | WO-0106575 A1 | 1/2001 |
| WO | WO-2010012389 A1 | 2/2010 |
| WO | WO-2010049079 A1 | 5/2010 |

* cited by examiner

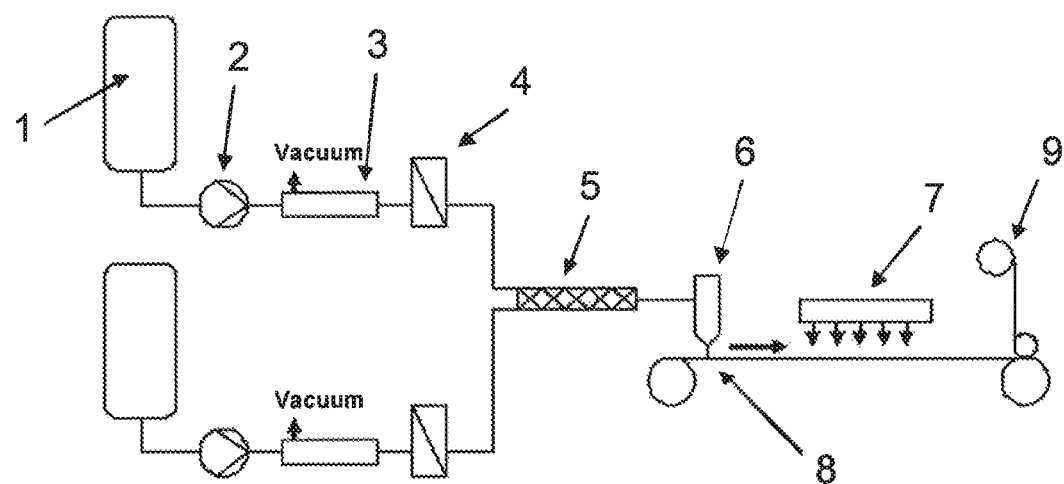
Schematic structure of a continuous film-coating system for the roll-to-roll method

DIELECTRIC POLYURETHANE FILM

CROSS-REFERENCE TO RELATED APPLICATIONS

This application is a national stage application (under 35 U.S.C. §371) of PCT/EP2013/063170, filed Jun. 24, 2013, which claims benefit of European Application No. 12173770.4, filed Jun. 27, 2012, both of which are incorporated herein by reference in their entirety.

The present invention relates to a process for producing a dielectric polyurethane film suitable especially for use in electromechanical transducers. The invention further provides a dielectric polyurethane film obtainable by the process according to the invention, a process for producing an electrochemical transducer, and an electrochemical transducer obtainable by this process.

Transducers—also called electromechanical transducers—convert electrical to mechanical energy and vice versa. They can be used as a constituent of sensors, actuators and/or generators.

The basic construction of such a transducer consists of electroactive polymers (EAP). The principle of construction and the mode of action are similar to those of an electrical capacitor. There is a dielectric between two plates under a potential difference. However, EAPs are an extensible dielectric which deforms in the electrical field. More specifically, they are dielectric elastomers, usually in film form (DEAP; dielectric electroactive polymer), which have high electrical resistivity and are coated on both sides by extensible electrodes having high conductivity (electrode), as described, for example, in WO-A 01/06575. This basic construction can be used in a wide variety of different configurations for production of sensors, actuators or generators. As well as single-layer constructions, multilayer constructions are also known.

Electroactive polymers as elastic dielectric in transducer systems must have different properties in different components according to the application: actuators/sensors or generators.

Shared electrical properties are: high electrical internal resistivity of the dielectric, high dielectric strength and high dielectric constant in the frequency range of the application. These properties allow long-term storage of a large amount of electrical energy in a very small volume filled with the electroactive polymer.

Shared mechanical properties are sufficiently high elongation at break, low persistent extension and sufficiently high compressive/tensile strengths. These properties ensure sufficiently high elastic deformability without mechanical damage to the energy transducer. For energy transducers which are operated under tension, it is particularly important that no persistent extension ("creep" should not occur, since no EAP effect is present any longer after a particular number of extension cycles) and do not exhibit any stress relaxation under mechanical load.

However, there are also different demands depending on the application: For actuators in tension mode, elastomers of highly reversible extensibility with high elongation at break and low tensile modulus of elasticity are required. For generators which are operated in extension, in contrast, a high tensile modulus of elasticity is advisable. The demands on internal resistivity are also different, for generators, much higher demands are made on internal resistivity than for actuators.

It is known from the literature for actuators that extensibility is proportional to the dielectric constant and the square of the voltage applied, and inversely proportional to the modulus. The voltage is in turn dependent on the dielectric strength, meaning that, if the dielectric strength is very low, a high voltage cannot be applied. Since the square of this value is present in the equation for calculation of the extension which is caused by the electromechanical attraction of the electrodes, the dielectric strength must be correspondingly high. A typical equation for this can be found in the book by Federico Carpi, Dielectric Elastomers as Electromechanical Transducers, Elsevier, page 314, equation 30.1, and similarly also in R. Pelrine, Science 287, 5454, 2000, page 837, equation 2. Actuators known to date either have too low a dielectric constant and/or dielectric strength or too high a modulus. Another disadvantage of known solutions is the low electrical resistivity, which leads to high leakage currents in actuators and in the worst case to electrical breakdown.

For generators, it is important that they result in a high electrical current yield with low losses. Typical losses arise at interfaces, in the course of charging and discharging of the dielectric elastomer and through leakage currents resulting from the dielectric elastomer. In addition, the resistivity of the electrically conductive electrode layer of the EAP results in an energy loss; the electrode should therefore again have minimum electrical resistivity. A description can be found in an article by Christian Graf and Juirgen Maas, Energy harvesting cycles based on electro active polymers, Proceedings of SPIE Smart structures, 2010, vol. 7642, 764217. It follows from the derivations according to equations 34 and 35 on page 9 (12) last sentence that the energy loss is at a minimum when the dielectric constant and the electrical resistivity are particularly high.

Since virtually all electroactive polymers are operated under cyclical stresses and with pre-extended structures, the materials must not have a tendency to flow under repeated cyclical stresses, and the creep should be as low as possible.

The prior art describes transducers containing various polymers as a constituent of the electroactive layer, see, for example, in WO-A 01/06575.

DE 10 2007 005 960 describes carbon black-filled polyether-based polyurethanes. A disadvantage of this invention is the very low electrical resistivity of the DEAP film, such that loss through heat is too high.

WO 2010/049079 describes one-component polyurethane systems in organic solvents. A disadvantage here is that only low degrees of branching can be used, and so the systems creep to much too high a degree under cyclical extension stresses. One-component polyurethane systems are possible only for linear unbranched systems having a functionality of 2 or less, and so the systems known from DE 10 2007 059 858 do not meet the demands. A one-component solution of higher functionality (in organic or aqueous solvents/dispersion) would lead to a gel or powder with infinite molar mass, which makes coating/film formation impossible. At the same time, owing to linearity, a reversible tension-elongation process, like the one that has to be employed in the case of EAPs, is impossible since it results in creep of the polymer. Furthermore, the electrical resistivity of the polyether systems described is too low.

EP 2 280 034 describes polyether polyols having too low an electrical resistivity.

EP2330649 describes various approaches to a solution. Both the tensile strengths and the electrical resistivities, and also the dielectric strength, are too low to arrive at high efficiencies of industrial relevance.

WO 2010012389 describes amine-crosslinked isocyanates, but here too the electrical resistivity and the dielectric strength are too low.

A disadvantage in all processes described in the prior art is that they cannot be performed infinitely in a roll-to-roll process, since:
a) the pot life of the mixture is much too low and blockage takes place in the application system
b) as a result of the 1-component mode of operation, the mixture solidifies after a short residence time prior to application in the roll-to-roll process in the application system (coating bar or the like)
c) the drying time is much too long.

It was therefore an object of the present invention to provide a continuous possess with which it is possible to obtain dielectric polyurethane films which have very high resilience, do not have a tendency to creep and have high electrical resistivity.

More particularly, the dielectric polyurethane films should have one or more of the following properties:
a) tensile strength >2 MPa, more preferably >4, very particularly >5 to DIN 53 504
b) elongation at break >200% to DIN 53 504
c) creep at 10% deformation after 30 min to DIN 53 441 <30% (more preferably <20, very particularly <10%)
d) dielectric strength >40 V/μm to ASTM D 149-97a (more preferably >60, most preferably >80)
e) electrical resistivity >1.5E12 ohm m to ASTM D 257 (more preferably >2E12, very particularly >5 E12, very particularly >1E13).
f) permanent elongation at 50% elongation to DIN 53 504 <3%
g) dielectric constant >5 at 0.01-1 Hz to ASTM D 150-98
h) layer thickness of a dielectric film <1000 μm (calculated as a monolayer).

The object of the invention is achieved by a process for producing a dielectric polyurethane film, in which at least the following steps are performed continuously:
I) a mixture comprising
a) a compound containing isocyanate groups and having a content of isocyanate groups of >10% by weight and ≤50% by weight,
b) a compound containing isocyanate-reactive groups and having an OH number of ≥20 and ≥150,
c) at least one solvent having a vapour pressure at 20° C. of >0.1 mbar and <200 mbar,
d) at least one wetting additive,
is produced,
where the sum of the number-average functionalities of isocyanate groups and of isocyanate-reactive groups in the compounds a) and b) is ≥2.6 and ≤6,
II) immediately after production thereof, the mixture is applied to a carrier in the form of a wet film,
III) the wet film is cured to form the polyurethane film and
IV) the polyurethane film is separated from the carrier.

The dielectric polyurethane film produced by the process according to the invention has good mechanical strength and high elasticity. In addition, it has good electrical properties such as a high dielectric strength, a high electrical resistivity and a high dielectric constant, and can therefore be used advantageously in an electromechanical transducer with high efficiency.

Suitable compounds a) in accordance with the invention are, for example, butylene 1,4-diisocyanate, hexamethylene 1,6-diisocyanate (HDI), isophorone diisocyanate (IPDI), 2,2,4- and/or 2,4,4-trimethylhexamethylene diisocyanate, the isomeric bis-(4,4'-isocyanatocyclohexyl)methanes (H12-MDI) or mixtures thereof with any isomer content, cyclohexylene 1,4-diisocyanate, 4-isocyanatomethyl-1,8-octane diisocyanate (nonane triisocyanate), phenylene 1,4-diisocyanate, tolylene 2,4- and/or 2,6-diisocyanate (TDI), naphthylene 1,5-diisocyanate, diphenylmethane 2,2'- and/or 2,4'- and/or 4,4'-diisocyanate (MDI), 1,3- and/or 1,4-bis(2-isocyanatoprop-2-yl)benzene (TMXDI), 1,3-bis(isocyanatomethyl)benzene (XDI), alkyl 2,6-diisocyanatohexanoates (lysine diisocyanates) having alkyl groups having 1 to 8 carbon atoms, and mixtures thereof. In addition, compounds containing modifications such as allophanate, uretdione, urethane, isocyanurate, biuret, iminooxadiazinedione or oxadiazinetrione structure and based on said diisocyanates are suitable units for component a), as are polycyclic compounds, for example polymeric MDI (pMDI) and combinations of all of these. Preference is given to modifications having a functionality of 2 to 6, preferably of 2.0 to 4.5 and more preferably of 2.6 to 4.2 and most preferably of 2.8 to 4.0 and more preferably of 2.8 to 3.8.

Particular preference is given to modification using diisocyanates from the group of HDI, IPDI, H12-MDI, TDI and MDI. Particular preference is given to using HDI. Very particular preference is given to using a polyisocyanate based on HDI and having a functionality of >2.6. Particular preference is given to using biurets, allophanates, isocyanurates and iminooxadiazinedione or oxadiazinetrione structure, very particular preference to using biurets. The preferred NCO content is >10% by weight, more preferably >15% and most preferably >18% by weight. The NCO content is <=50% by weight, preferably <40% by weight, most preferably <35% by weight, most preferably <30% by weight and most preferably <25% by weight. The NCO content is more preferably between 18 and 25% by weight. Very particular preference is given to using, as a) modified aliphatic isocyanates based on HDI, those having a free, unreacted monomeric content of free isocyanate of <0.5% by weight.

In a preferred embodiment, the compound a) has a number-average functionality of isocyanate groups of ≥2.0 and ≤4.

It is also advantageous, more particularly, when the compound a) comprises or consists of an aliphatic polyisocyanate, preferably hexamethylene diisocyanate and more preferably a biuret and/or isocyanurate of hexamethylene diisocyanate.

According to the prior art, the isocyanate groups may also be present in partially or completely blocked form until their reaction with the isocyanate-reactive groups, and so they cannot react immediately with the isocyanate-reactive group. This ensures that the reaction does not take place until at a particular temperature (blocking temperature). Typical blocking agents can be found in the prior art and are selected such that they are eliminated again from the isocyanate group at temperatures between 60 and 220° C., according to the substance, and only then react with the isocyanate-reactive group. There are blocking agents which are incorporated into the polyurethane, and also those which remain as a solvent or plasticizer in the polyurethane or outgas from the polyurethane. Reference is also made to blocked NCO values. If the invention refers to NCO values, this is always based on the unblocked NCO value. Blocking is usually effected up to <0.5%. Typical blocking agents are, for example, caprolactam, methyl ethyl ketoxime, pyrazoles, for example 3,5-dimethyl-1,2-pyrazole or 1-pyrazole, triazoles, for example 1,2,4-triazole, diisopropylamine, diethyl malonate, diethylamine, phenol or derivatives thereof, or imidazole.

The isocyanate-reactive groups of compound b) are functional groups which can react to form covalent bonds with isocyanate groups. More particularly, these may be amine, epoxy, hydroxyl, thiol, mercapto, acryloyl, anhydride, vinyl and/or carbinol groups. More preferably, the isocyanate-reactive groups are hydroxyl and/or amine groups.

It is advantageous when the compound b) has a number-average functionality of isocyanate-reactive groups of ≥2.0 and ≤4, the isocyanate-reactive groups preferably being hydroxyl and/or amine.

The compound b) may preferably have an OH number ≥27 and ≤150 and more preferably ≥27 and ≤120 mg KOH/g.

The mean functionality of an isocyanate-reactive group in b) may be from 1.5 to 6, preferably from 1.8 to 4 and more preferably from 1.8 to 3.

The number-average molar mass of b) may be 1000-8000 g/mol, preferably 1500-4000 g/mol and more preferably 1500-3000 g/mol.

It is additionally preferable when the isocyanate-reactive group of compound b) is a polymer.

In an advantageous embodiment of the process according to the invention, the compound b) comprises or consists of a diol and more preferably a polyester diol and/or a polycarbonate diol.

In the compound b) it is possible to use polyether polyols, polyether amines, polyether ester polyols, polycarbonate polyols, polyether carbonate polyols, polyester polyols, polybutadiene derivatives, polysiloxane-based derivatives and mixtures thereof. Preferably, however, b) comprises or consists of a polyol having at least two isocyanate-reactive hydroxyl groups. Very particularly preferably, b) comprises polyether polyols, polyester polyols, polycarbonate polyols and polyether ester polyols, polybutadiene polyols, polysiloxane polyols, more preferably polybutadienols, polysiloxane polyols, polyester polyols and/or polycarbonate polyols, most preferably polyester polyols and/or polycarbonate polyols.

Suitable polyester polyols may be polycondensates of di- and optionally tri- and tetraols and di- and optionally tri- and tetracarboxylic acids or hydroxycarboxylic acids or lactones. Instead of the free polycarboxylic acids, it is also possible to use the corresponding polycarboxylic anhydrides or corresponding polycarboxylic esters of lower alcohols for preparation of the polyesters.

Polyester polyols are prepared in a manner known per se by polycondensation from aliphatic and/or aromatic polycarboxylic acids having 4 to 16 carbon atoms, optionally from the anhydrides thereof and optionally from the low molecular weight esters thereof, including cyclic esters, the reaction components used being predominantly low molecular weight polyols having 2 to 12 carbon atoms. Examples of suitable alcohols are ethylene glycol, butylene glycol, diethylene glycol, triethylene glycol, polyalkylene glycols such as polyethylene glycol, and also propane-1,2-diol, propane-1,3-diol, butane-1,3-diol, butane-1,4-diol, hexane-1,6-diol and isomers, neopentyl glycol or neopentyl glycol hydroxypivalate or mixtures thereof, preference being given to hexane-1,6-diol and isomers, butane-1,4-diol, neopentyl glycol and neopentyl glycol hydroxypivalate. In addition, it is also possible to use polyols such as trimethylolpropane, glycerol, erythritol, pentaerythritol, trimethylolbenzene or trishydroxyethyl isocyanurate or mixtures thereof. Particular preference is given to using diols, very particular preference to using butane-1,4-diol and hexane-1,6-diol, most preferably hexane-1,6-diol.

The dicarboxylic acids used may, for example, be phthalic acid, isophthalic acid, terephthalic acid, tetrahydrophthalic acid, hexahydrophthalic acid, cyclohexanedicarboxylic acid, adipic acid, azelaic acid, sebacic acid, glutaric acid, tetrachlorophthalic acid, maleic acid, fumaric acid, itaconic acid, malonic acid, suberic acid, 2-methylsuccinic acid, 3,3-diethylglutaric acid and/or 2,2-dimethylsuccinic acid. The acid sources used may also be the corresponding anhydrides.

It is additionally also possible to use monocarboxylic acids such as benzoic acid and hexanecarboxylic acid.

Preferred acids are aliphatic or aromatic acids of the aforementioned type. Particular preference is given to adipic acid, isophthalic acid and phthalic acid, very particular preference to isophthalic acid and phthalic acid.

Hydroxycarboxylic acids which can additionally be used as reaction participants in the preparation of a polyester polyol having terminal hydroxyl groups are, for example, hydroxycaproic acid, hydroxybutyric acid, hydroxydecanoic acid or hydroxystearic acid, or mixtures thereof. Suitable lactones are caprolactone, butyrolactone or homologues or mixtures thereof. Preference is given to caprolactone.

Very particular preference is given to using polyester diols, most preferably based on reaction products of adipic acid, isophthalic acid and phthalic acid with butane-1,4-diol and hexane-1,6-diol.

As compounds b) containing isocyanate-reactive groups, it is possible to use polycarbonates having hydroxyl groups, for example polycarbonate polyols, preferably polycarbonate diols. These can be obtained by reaction of carbonic acid derivatives such as diphenyl carbonate, dimethyl carbonate or phosgene, by means of polycondensation with polyols, preferably diols.

Examples of diols suitable for this purpose are ethylene glycol, propane-1,2- and 1,3-diol, butane-1,3- and 1,4-diol, hexane-1,6-diol, octane-1,8-diol, neopentyl glycol, 1,4-bis-hydroxymethylcyclohexane, 2-methyl-1,3-propanediol, 2,2,4-trimethylpentane-1,3-diol, dipropylene glycol, polypropylene glycols, dibutylene glycol, polybutylene glycols, bisphenol A, 1,10-decanediol, 1,12-dodecanediol or lactone-modified diols of the aforementioned type or mixtures thereof.

The diol component preferably contains from 40 percent by weight to 100 percent by weight of hexanediol, preferably hexane-1,6-diol and/or hexanediol derivatives. Such hexanediol derivatives are based on hexanediol and may, as well as terminal OH groups, have ester or ether groups. Such derivatives are obtainable, for example, by reaction of hexanediol with excess caprolactone or by etherification of hexanediol with itself to give di- or trihexylene glycol. The amount of these and other components are selected in a known manner in the context of the present invention such that the sum does not exceed 100 percent by weight, and more particularly is 100 percent by weight.

Polycarbonates having hydroxyl groups, especially polycarbonate polyols, are preferably of linear structure. Particular preference is given to using a polycarbonate diol based on 1,6-hexanediol.

It is likewise possible, though less preferred, to use polyether polyols in b). For example, polytetramethylene glycol polyethers are suitable, as obtainable by polymerization of tetrahydrofuran by means of cationic ring opening. Polyether polyols which are likewise suitable may be the addition products of styrene oxide, ethylene oxide, propylene oxide, butylene oxide and/or epichlorohydrin onto di- or polyfunctional starter molecules. Examples of suitable starter molecules which may be used include water, butyl diglycol, glycerol, diethylene glycol, trimethylolpropane, propylene glycol, sorbitol, ethylenediamine, triethanolamine or 1,4-butanediol, or mixtures thereof.

It is also possible to use hydroxy-functional oligobutadiene, hydrogenated hydroxy-functional oligobutadiene, hydroxy-functional siloxanes, glycerol or TMP monoallyl ether, alone or in any desired mixture.

In addition, polyether polyols can preferably be prepared by means of alkaline catalysis or by means of double metal cyanide catalysis or optionally, in the case of a stepwise reaction, by means of alkaline catalysis and double metal cyanide catalysis from a starter molecule and epoxides, preferably ethylene oxide and/or propylene oxide, and have terminal hydroxyl groups. A description of double metal cyanide catalysts (DMC catalysis) can be found, for example, in the patent specification U.S. Pat. No. 5,158,922 and the published specification EP 0 654 302 A1.

Useful starters here include the compounds which are known to those skilled in the art and have hydroxyl and/or amino groups, and also water. The functionality of the starters here is at least 2 and at most 6. It will be appreciated that it is also possible to use mixtures of several starters. Additionally usable as polyether polyols are also mixtures of two or more polyether polyols.

Suitable compounds b) are also ester diols such as α-hydroxybutyl ∈-hydroxycaproate, ω-hydroxyhexyl γ-hydroxybutyrate, β-hydroxyethyl adipate or bis(β-hydroxyethyl)terephthalate.

Moreover, it is also possible to additionally use monofunctional compounds in step I). Examples of such monofunctional compounds are ethanol, n-butanol, ethylene glycol monobutyl ether, diethylene glycol monomethyl ether, diethylene glycol monobutyl ether, propylene glycol monomethyl ether, dipropylene glycol monomethyl ether, tripropylene glycol monomethyl ether, dipropylene glycol monopropyl ether, propylene glycol monobutyl ether, dipropylene glycol monobutyl ether, tripropylene glycol monobutyl ether, 2-ethylhexanol, 1-octanol, 1-dodecanol or 1-hexadecanol or mixtures thereof.

Less preferably, it is possible in step I) to additionally add proportions of chain extender or crosslinking agent to compound b). Preference is given here to using compounds having a functionality of 2 to 3 and a molecular weight of 62 to 500. It is possible to use aromatic or aliphatic aminic chain extenders, for example diethyltoluenediamine (DETDA), 3,3'-dichloro-4,4'-diaminodiphenylmethane (MBOCA), 3,5-diamino-4-chloroisobutyl benzoate, 4-methyl-2,6-bis(methylthio)-1,3-diaminobenzene (Ethacure 300), trimethylene glycol di-p-aminobenzoate (Polacure 740M) and 4,4'-diamino-2,2'-dichloro-5,5'-diethyldiphenylmethane (MCDEA). Particular preference is given to MBOCA and 3,5-diamino-4-chloroisobutyl benzoate. Components suitable in accordance with the invention for chain extension are organic di- or polyamines. For example, it is possible to use ethylenediamine, 1,2-diaminopropane, 1,3-diaminopropane, 1,4-diaminobutane, 1,6-diaminohexane, isophoronediamine, isomer mixture of 2,2,4- and 2,4,4-trimethylhexamethylenediamine, 2-methylpentamethylenediamine, diethylenetriamine, diaminodicyclohexylmethane or dimethylethylenediamine, or mixtures thereof.

In addition, it is also possible to use compounds which, as well as a primary amino group, also have secondary amino groups or, as well as an amino group (primary or secondary), also have OH groups. Examples thereof are primary/secondary amines, such as diethanolamine, 3-amino-1-methylaminopropane, 3-amino-1-ethylaminopropane, 3-amino-1-cyclohexylaminopropane, 3-amino-1-methylaminobutane, alkanolamines such as N-aminoethylethanolamine, ethanolamine, 3-aminopropanol, neopentanolamine. For chain termination, it is customary to use amines having a group reactive towards isocyanates, such as methylamine, ethylamine, propylamine, butylamine, octylamine, laurylamine, stearylamine, isononyloxypropylamine, dimethylamine, diethylamine, dipropylamine, dibutylamine, N-methylaminopropylamine, diethyl(methyl)aminopropylamine, morpholine, piperidine, or suitable substituted derivatives thereof, amide amines formed from diprimary amines and monocarboxylic acids, monoketime of diprimary amines, primary/tertiary amines such as N,N-dimethylaminopropylamine.

These often have a thixotropic effect on account of their high reactivity, and so the rheology is altered to such an extent that the mixture on the substrate has a higher viscosity. Examples of non-aminic chain extenders often used are 2,2'-thiodiethanol, propane-1,2-diol, propane-1,3-diol, glycerol, butane-2,3-diol, butane-1,3-diol, butane-1,4-diol, 2-methylpropane-1,3-diol, pentane-1,2-diol, pentane-1,3-diol, pentane-1,4-diol, pentane-1,5-diol, 2,2-dimethylpropane-1,3-diol, 2-methylbutane-1,4-diol, 2-methylbutane-1,3-diol, 1,1,1-trimethylolethane, 3-methylpentane-1,5-diol, 1,1,1-trimethylolpropane, hexane-1,6-diol, heptane-1,7-diol, 2-ethylhexane-1,6-diol, octane-1,8-diol, nonane-1,9-diol, decane-1,10-diol, undecane-1,11-diol, dodecane-1,12-diol, diethylene glycol, triethylene glycol, cyclohexane-1,4-diol, cyclohexane-1,3-diol and water.

More preferably, a) and b) have low contents of free water, residual acids and metal contents. The residual water content of b) is preferably <1% by weight, more preferably <0.7% by weight (based on b)). The residual acid content of b) is preferably <1% by weight, more preferably <0.7% by weight (based on b)). The residual metal contents, caused, for example, by residues of catalyst constituents which are used in the preparation of the reactants, should preferably be less than 1000 ppm and further preferably be less than 500 ppm, based on a) or b).

The ratio of isocyanate-reactive groups to isocyanate groups in the mixture of step I) may be from 1:3 to 3:1, preferably from 1:1.5 to 1.5:1, more preferably from 1:1.3 to 1.3:1 and most preferably from 1:1.02 to 1:0.95.

The mixture of step I) may, as well as the compounds a) and b), additionally also comprise assistants and additives. Examples of such assistants and additives are crosslinkers, thickeners, solvents, thixotropic agents, stabilizers, antioxidants, light stabilizers, emulsifiers, surfactants, adhesives, plasticizers, hydrophobizing agents, pigments, fillers, rheology improvers, degassing and defoaming aids, wetting additives and catalysts. The mixture of step I) more preferably comprises wetting additives. Typically, the wetting additive is present in the mixture in an amount of 0.05 to 1.0% by weight. Typical wetting additives are available, for example, from Altana (Byk additives, for instance: polyester-modified polydimethylsiloxane, polyether-modified polydimethylsiloxane or acrylate copolymers, and also, for example, C6F13 fluorotelomers).

The mixture of step I) preferably comprises fillers having a high dielectric constant. Examples thereof are ceramic fillers, especially barium titanate, titanium dioxide and piezoelectric ceramics such as quartz or lead zirconium titanate, and organic fillers, especially those having high electrical polarizability, for example phthalocyanines, poly-3-hexylthiophene. The addition of these fillers can increase the dielectric constant of the polyurethane film.

In addition, a higher dielectric constant is also attainable by the introduction of electrically conductive fillers below the percolation threshold. Examples of such substances are carbon black, graphite, graphene, fibres, single-wall or multiwall carbon nanotubes, electrically conductive polymers such as polythiophenes, polyanilines or polypyrroles, or mixtures thereof. In this context, carbon black types of particular interest are those which have surface passivation and therefore, at low concentrations below the percolation threshold, increase the dielectric constant but nevertheless do not lead to an increase in the conductivity of the polymer.

In the context of the present invention, it is possible to add additives to increase the dielectric constants and/or the electrical breakdown field strength even after filming in steps II) and III). This can be effected, for example, by generating one or more further layers or through penetration of the polyurethane film, for example by inward diffusion.

The solvents used may be aqueous and organic solvents.

It is possible with preference to use a solvent having a vapour pressure at 20° C. of >0.1 mbar and <200 mbar, preferably >0.2 mbar and <150 mbar and more preferably >0.3 mbar and <120 mbar. This solvent can especially be added to the mixture of step I). It is particularly advantageous here that the inventive films can be produced on a roll-coating system.

The polyurethane film may have a layer thickness of 0.1 µm to 1000 µm, preferably of 1 µm to 500 µm, more preferably of 5 µm to 200 µm and most preferably of 10 µm to 100 µm.

The mixture of step I) can be applied to the carrier in step II) in a roll-to-roll process, for example by bar coating, painting, pouring, spinning, spraying, extrusion. The mixture is preferably applied to the carrier with a coating bar (for instance a smooth coating bar, comma bar, or the like), rolling (for instance anilox rollers, engraved rollers, smooth rollers, or the like) or a die. The die may be part of a die application system. It is also possible to operate several application systems simultaneously or successively. It is also possible to apply several layers simultaneously with one application system. Preference is given to using a die and particular preference to using a residence time-optimized and/or recirculation-free die. Most preferably, the distance of the die from the carrier is less than three times the thickness of the wet film, preferably less than twice the thickness of the wet film and more preferably less than one-and-a-half times the thickness of the wet film. If, for example, 150 µm of wet film are coated on (when the wet film contains 20% by weight of solvent, this therefore corresponds to 120 µm of cured film), the distance selected from the die to the carrier should be <300 µm. If the distance from the die to the carrier is selected as described above, the films can be produced using a roller coating system.

In a further preferred embodiment of the process according to the invention, a wet film having a thickness of 10 to 300 µm, preferably of 15 to 150 µm, further preferably of 20 to 120 µm and most preferably of 20 to 80 µm can be produced in step II).

It is likewise preferable when the wet film is cured in step III) by conducting it through a first drying section preferably having a temperature of ≥40° C. and ≤120° C., further preferably ≥60° C. and ≤110° C. and especially preferably ≥60° C. and ≤100° C.

The wet film after the first drying section can also additionally be conducted through a second drying section preferably having a temperature of ≥60° C. and ≤130° C., further preferably ≥80° C. and ≤120° C. and especially preferably ≥90° C. and ≤120° C.

In addition, the wet film after the second drying section can also be conducted through a third drying section preferably having a temperature of ≥110° C. and ≤180° C., further preferably ≥110° C. and ≤150° C. and especially preferably ≥110° C. and ≤140° C.

The drying can be performed by suspension or in roller dryers, as supplied on the market, for example, by Krönert, Coatema, Drytec or Polytype.

The typical speed with which the wet film on the carrier is conducted through the drying section(s) is >0.5 m/min and <600 m/min, more preferably >0.5 m/min and <500 m/min and more preferably >0.5 m/min and <100 m/min.

The drying section length and the air feed of the drying sections are matched to the speed. Usually, the total residence time of the wet film in the drying section(s) is ≥10 seconds and ≤60 minutes, preferably ≥30 seconds and ≤40 minutes, further preferably ≥40 seconds and ≤30 minutes and most preferably ≥40 seconds and ≤10 minutes.

The inventive dielectric polyurethane film can be provided with further functional layers, for example conductive layers, barrier layers against solvents and gases, and/or adhesion layers. This can be done on one or both sides, in one layer or in several layers one on top of another, by complete coating or by coating over partial areas.

Suitable carriers for the production of a polymer film from the reaction mixture are especially glass, release paper, films and plastics, from which the dielectric polyurethane film produced can be separated in a simple manner. Particular preference is given to using paper or films. Paper can be coated on one or both sides, for example with silicone or plastics. The coating and/or the film may be produced, for example, from polymers, for instance polyethylene, polypropylene, polymethylpentene, polyethylene terephthalate, polypropylene, polyethylene, polyvinyl chloride, Teflon, polystyrene, polybutadiene, polyurethane, acrylic ester-styrene-acrylonitrile, acrylonitrile/butadiene/acrylate, acrylonitrile-butadiene-styrene, acrylonitrile/chlorinated polyethylene/styrene, acrylonitrile/methyl methacrylate, butadiene rubber, butyl rubber, casein polymers, artificial horn, cellulose acetate, cellulose hydrate, cellulose nitrate, chloroprene rubber, chitin, chitosan, cycloolefin copolymers, epoxy resin, ethylene-ethyl acrylate copolymer, ethylene-propylene copolymer, ethylene-propylene-diene rubber, ethylene-vinyl acetate, fluoro rubber, urea-formaldehyde resin, isoprene rubber, lignin, melamine-formaldehyde resin, melamine/phenol-formaldehyde, methyl acrylate/butadiene/styrene, natural rubber (gum arabic), phenol-formaldehyde resin, perfluoroalkoxyalkane, polyacrylonitrile, polyamide, polybutylene succinate, polybutylene terephthalate, polycaprolactone, polycarbonate, polychlorotrifluoroethylene, polyester, polyesteramide, polyether-block-amide, polyetherimide, polyether ketones, polyether sulphone, polyhydroxyalkanoates, polyhydroxybutyrate, polyimide, polyisobutylene, polylactide (polylactic acid), polymethylmethacrylimide, polymethylene terephthalate, polymethyl methacrylate, polymethylpentene, polyoxymethylene or polyacetal, polyphenylene ether, polyphenylene sulphide, polyphthalamide, polypyrrole, polystyrene, polysulphone, polytetrafluoroethylene, polyurethane PUR, polyvinyl acetate, polyvinyl butyral, polyvinyl chloride, polyvinylidene fluoride, polyvinylpyrrolidone, silicone, styrene-acrylonitrile copolymer, styrene-butadiene rubber, styrene-butadiene-styrene, thermoplastic starch, thermoplastic polyurethane, vinyl chloride/ethylene, vinyl chloride/ethylene/methacrylate. Alternatively, these polymers can also be used directly as carrier materials and/or additionally be provided with further internal or external release agents or layers. The layers may have barrier functions or else contain conductive structures which may be able to transfer to the dielectric polyurethane film. The polymers may be axially or biaxially oriented or stretched, and be pressure- or corona-pretreated. The films may also be reinforced. Typical reinforcements are woven fabrics, for example textile, or glass fibres.

In a particularly preferred embodiment, it is possible to use a carrier made of glass, plastic or paper, and preferably made of silicone or plastic-coated paper.

After coating, the film or paper can be directly pulled off and reused. In a particular embodiment, the film can be run in a cycle and the dielectric polyurethane film, when it is pulled off, can be transferred directly to a new carrier. In a preferred embodiment, the carrier is provided with a structure. This is also referred to as embossing. The embossing is done in such a way that the structure is transferred to the dielectric polyurethane film, in such a way that the embossing is formed only in the surface of the dielectric polyurethane film. The embossing is pulled flat when the film is extended. The embossing is such that an electrode layer on the film is pulled flat in the event of extension, without any noticeable extension of this layer itself. The embossing is preferably imprinted into the carrier in a roll-to-roll process. For example, embossing is effected here by means of a roller into a cold thermoplastic, or into a hot thermoplastic by means of a cooling process. Typical embossings are described, for example, in EP 1 919 071.

There follows a description, by way of example, of an industrial scale process for continuous production of the inventive dielectric polyurethane film.

The FIGURE shows the schematic structure of the coating system used. In the FIGURE, the individual components have the following reference numerals:

1 reservoir vessel
2 metering device
3 vacuum degassing device
4 filter
static mixer
6 coating device
7 air circulation dryer
8 carrier
9 cover layer Component b) was introduced into one of the two reservoir vessels 1 of the coating system. Component a) was introduced into the second reservoir vessel 1. Each of the two components were then conveyed by the metering devices 2 to the vacuum degassing device 3, and degassed. From here, they were then each passed through the filters 4 into the static mixer 5, in which the components were mixed. The liquid material obtained was then fed to the coating device 6.

The coating device 6 in the present case was a slot die. With the aid of the coating device 6, the mixture was applied as a wet film to a carrier 8 and then cured in the air circulation dryer 7. This gave a dielectric polyurethane film, which was then provided with a cover layer 9 and wound up.

The present invention further provides a dielectric polyurethane film obtainable by the process according to the invention The invention still further provides a layer structure comprising a carrier substrate, an inventive dielectric polyurethane film applied thereto, and optionally a cover layer applied to the side of the film remote from the carrier substrate.

The layer structure may especially have one or more cover layers on the film in order to protect it from soil and environmental influences. For this purpose, it is possible to use polymer films or film composite systems, or else clearcoats.

The cover layers used are preferably film materials analogous to the materials used in the carrier, and these may have a thickness of typically 5 to 200 µm, preferably 8 to 125 µm, more preferably 20 to 50 µm.

Preference is given to cover layers having a very smooth surface. A measure used here is the roughness, determined to DIN EN ISO 4288 "Geometrical Product Specifications (GPS)—Surface texture . . . ", test condition: R3z front and reverse sides. Preferred roughnesses are in the region of less than or equal to 2 µm, preferably less than or equal to 0.5 µm.

The cover layers used are preferably PE or PET films of thickness 20 to 60 µm. More preferably, a polyethylene film having a thickness of 40 µm is used.

It is likewise possible that, in the case of a layer structure on the carrier, a further cover layer is applied as a protective layer.

The invention likewise provides a process for producing an electromechanical transducer, in which, in a first step, a process according to the invention is used to produce a dielectric polyurethane film and, in a second step, one electrode is applied to each of the opposite sides of the dielectric polyurethane film.

The electrodes can be applied, for example, by means of a printing process, for instance inkjet, flexographic printing, screen printing, or by means of a coating bar, die or roller, or else by means of metallization under reduced pressure. Typical materials are based on carbon or on metals, for instance silver, copper, aluminium, gold, nickel, zinc or other conductive metals and materials. The metal may be applied as a salt or as a solution, as a dispersion or emulsion, or else as a precursor.

The invention further provides an electromechanical transducer obtainable by this process.

In the electromechanical transducer, the dielectric polyurethane film may especially be disposed between the electrodes in such a way that the dielectric polyurethane film contacts at least one of the electrodes.

In one embodiment of the present invention, the dielectric polyurethane film may also be disposed between the electrodes in such a way that the electrodes adjoin it on opposite side of the dielectric polyurethane film.

For construction of an inventive transducer, the inventive dielectric polyurethane films, as described, for example, in WO 01/06575, can be coated on both sides with electrodes.

It is likewise possible in the context of the present invention to produce the electrodes and the dielectric polyurethane film in separate steps and to join them together subsequently. Typical methods would, for example, be adhesive bonding or lamination.

The transducer can advantageously be used in a wide variety of different configurations for production of sensors, actuators and/or generators.

The present invention therefore further provides an electronic and/or electric device, especially a module, automatic device, instrument or component, comprising an inventive electromechanical transducer.

The present invention further relates to the use of an inventive electromechanical transducer in an electronic and/or electric device, especially in an actuator, sensor or generator. Advantageously, the invention can be implemented in a multitude of very different applications in the electromechanical and electroacoustic sector, especially in the sectors of energy harvesting from mechanical vibrations, acoustics, ultrasound, medical diagnostics, acoustic microscopy, mechanical sensing, especially pressure, force and/or expansion sensing, robotics and/or communications technology. Typical examples thereof are pressure sensors, electroacoustic transducers, microphones, loudspeakers, vibration transducers, light deflectors, membranes, modulators for glass fibre optics, pyroelectric detectors, capacitors and control systems and "intelligent" floors, and also systems for conversion of water wave energy, especially sea wave energy, to electrical energy.

EXAMPLES

The invention is illustrated in detail hereinafter by examples.

Unless indicated otherwise, all percentages are based on weight.

Unless stated otherwise, all analytical measurements were conducted at temperatures of 23° C. under standard conditions.

Methods:

Unless explicitly mentioned otherwise, NCO contents were determined by volumetric means to DIN EN ISO 11909.

The viscosities reported were determined by means of rotary viscometry to DIN 53019 at 23° C. with a rotary viscometer from Anton Paar Germany GmbH, Germany, Helmuth-Hirth-Str. 6, 73760 Ostfildern.

Measurements of film layer thicknesses were conducted with a mechanical gauge from Dr. Johannes Heidenhain GmbH, Germany, Dr.-Johannes-Heidenhain-Str. 5, 83301 Traunreut. The specimens were analysed at three different sites and the mean was used as a representative measurement.

The tensile tests were executed by means of a tensile tester from Zwick, model number 1455, equipped with a load cell of overall measurement range 1 kN to DIN 53 504 with a pulling speed of 50 mm/min. The specimens used were S2 tensile specimens. Each measurement was executed on three specimens prepared in the same way, and the mean of the data obtained was used for assessment. Specifically for this purpose, as well as the tensile strength in [MPa] and the elongation at break in [%], the stress in [MPa] at 100% and 200% elongation was determined.

The permanent extension was determined by means of a Zwicki tensile tester from Zwick/Roell, equipped with a load cell of overall measurement range 50 N, on an S2 specimen of the sample to be examined. This measurement involved extending the sample at a rate of 50 mm/min up to n*50%, on attainment of this deformation releasing the strain on the sample to force=0 N, and measuring the extension still present. Directly thereafter, the next measurement cycle starts with n=n+1; the value of n is increased until the sample breaks. Here, only the value for 50% deformation is measured.

The determination of stress relaxation was likewise executed using the Zwick tensile tester, the instrumentation corresponds to the experiment for determination of permanent extension. The specimen used here was a sample strip of dimensions 60×10 mm², which was clamped with a clamp separation of 50 mm. After very rapid deformation to 55 mm, this deformation was kept constant for a period of 30 min and the force profile was determined over this time. The stress relaxation after 30 min is the percentage decline in stress, based on the starting value directly after deformation to 55 mm.

The measurements of dielectric constant to ASTM D 150-98 were executed with a test setup from Novocontrol Technologies GmbH & Co. KG, Obererbacher Straße 9, 56414 Hundsangen, Germany (measurement bridge: Alpha-A Analyzer, measurement head: ZGS Active Sample Cell Test Interface) with a specimen diameter of 20 mm. A frequency range from $10^7$ Hz to $10^{-2}$ Hz was examined. The measure used for the dielectric constant of the material examined was the real part of the dielectric constant at 10-0.01 Hz.

Electrical resistivity was measured by means of a laboratory setup from Keithley Instruments (Keithley Instruments GmbH, Landsberger Straße 65, D-82110 Germering, Germany) model No.: 6517 A and 8009 to ASTM D 257, a method for determining the insulation resistance of materials.

The determination of dielectric strength to ASTM D 149-97a was conducted with a hypotMAX high-voltage source from Associated Research Inc, 13860 W Laurel Drive, Lake Forest, Ill. 600045-4546, USA, and a sample holder constructed in-house. The sample holder contacts the polymer samples of homogeneous thickness with only low mechanical pretension, and prevents the user from coming into contact with the voltage. The non-pretensioned polymer film in this setup is subjected to static load with rising voltage until electrical breakdown through the film occurs. The measurement result is the voltage attained at breakdown, based on the thickness of the polymer film in [V/µm]. 5 measurements are executed per film and the average is reported.

Substances and Abbreviations Used:

Desmodur® N100 biuret based on hexamethylene diisocyanate, NCO content 220±0.3% (to DIN EN ISO 11 909), viscosity at 23° C. 10000±2000 mPa·s, Bayer MaterialScience AG, Leverkusen, DE Desmodur® N3300 isocyanurate based on hexamethylene diisocyanate, NCO content 21.8±0.3% (to DIN EN ISO 11 909), viscosity at 23° C. 3000±750 mPa·s, Bayer MaterialScience AG, Leverkusen, DE Desmodur® XP 2599 aliphatic prepolymer containing ether groups and based on hexamethylene 1,6-diisocyanate (HDI), isocyanate content 6±0.5% (DIN EN ISO 11 909), viscosity at 23° C. 2500±500 mPa·s, Bayer MaterialScience AG, Leverkusen, DE Desmodur® N75 BA 75% Desmodur® N100 and 25% butyl acetate; 160±50 mPas, Bayer MaterialScience AG, Leverkusen, DE Desmodur® N75 MPA 75% Desmodur® N100 and 25% methoxypropyl acetate, 250±75 mPas, Bayer MaterialScience AG, Leverkusen, DE Arcol PPG 2000 DMC-catalysed polypropylene oxide of mean molar mass Mn=2000; product from Bayer MaterialScience AG P200H/DS polyester polyol based on 1,6-hexanediol and phthalic anhydride, molar mass 2000 g/mol, Bayer MaterialScience AG, Leverkusen, DE Desmophen® C2201 polycarbonate polyol based on 1,6-hexanediol, prepared by reaction with dimethyl carbonate, molar mass 2000 g/mol, Bayer MaterialScience AG, Leverkusen, DE Desmophen® C 2200 linear aliphatic polycarbonate diol having terminal hydroxyl groups and a molecular weight of approx. 2000 g/mol, Bayer MaterialScience AG, Leverkusen, DE.

Irganox® 1076 octadecyl 3-(3,5-di-tert-butyl-4-hydroxyphenyl)propionate, Ciba Specialty Chemicals Inc., Basle, CH Terathane® 650 INVISTA GmbH, D-65795 Hatterheim, poly-THF of molar mass Mn=650 g/mol
PolyTHF® 1000 BASF AG poly-THF of molar mass Mn=1000 g/mol
Ketjenblack EC 300 J product from Akzo Nobel AG
Tib Kat 220 butyltin tris(2-ethylhexanoate), from Tib Chemicals AG, Mannheim
Metacure® T-12 dibutyltin dilaurate from Air Products and Chemicals, Inc.
DBTDL dibutyltin dilaurate from E. Merck KGaA, Frankfurter Str. 250, D-64293 Darmstadt, Germany
BYK 310 solution of a polyester-modified polydimethylsiloxane, Altana
BYK 3441 solution of an acrylate copolymer, Altana.
Desmophen® C 1200 linear aliphatic polycarbonate polyester, Bayer MaterialScience AG, Leverkusen, DE.
Butyl acetate and methoxypropyl acetate from Sigma-Aldrich.
Hostaphan RN 2SLK: release film from Mitsubishi based on polyethylene terephthalate with silicone coating. A film of width 300 mm was used.
Release paper polymethylpentene-coated release paper.

For the coating experiments of the inventive examples, a Coatema coating system with 7 dryers in a continuous roll-to-roll process was used. Application system: slot die from TSE Troller, Switzerland. Unless mentioned otherwise, the distance from the die to the carrier was set to 100 m. A two-component low-pressure casting machine with two gear pumps (heated), stirred and heatable vessels, heatable hoses and filters was used. In addition, a static heatable mixer was used. A first drying section was operated at 80° C. (air feed 2 m/s), a second drying section at 100° C. (air feed 3 m/s), a third drying section at 110° C. (air feed 8 m/s), a fourth drying section at 130° C. (air feed 7, 5, 2, 2 m/s). The web speed of the carrier was regulated at 1 m/min; the air feed blown into the drying sections was dry air. The layer thickness of the finished dielectric polyurethane film was 100 μm.

The inventive examples were producible continuously for more than 8 hours without blockage of the application system or occurrence of coating defects.

Example 1

21.39 parts by weight of Desmodur N100 were reacted with a polyol mixture of 0.0024 part by weight of Tib Kat 220 and 100 parts by weight of P200H/DS. The isocyanate (Desmodur N100) was used at 40° C., the polyol blend (P200H/DS with TIB Kat 220) at 80° C. The hoses for the respective components were heated to 40° C. and 80° C. respectively. The static mixer was heated to 65° C.; the die was at 60° C. The ratio of NCO to OH groups was 1.07. It was poured onto the Hostaphan film.

Example 2

21.39 parts by weight of Desmodur N100 were reacted with a polyol mixture of 0.0024 part by weight of Tib Kat 220 and 100 parts by weight of Desmophen C2201. The isocyanate (Desmodur N100) was used at 40° C., the polyol blend (Desmophen C2201 with TIB Kat 220) at 80° C. The hoses for the respective components were heated to 40° C. and 80° C. respectively. The static mixer was heated to 65° C.; the die was at 60° C. The ratio of NCO to OH groups was 1.07. It was poured onto the Hostaphan film.

Example 3

151.50 parts by weight of Desmodur N75 MPA were reacted with a polyol mixture of 0.02 part by weight of Tib Kat 220 and 536.84 parts by weight of P200H/DS, 3.24 parts by weight of Byk 310 and 308.41 parts by weight of methoxypropyl acetate. The isocyanate (Desmodur N75 MPA) was used at 23° C., the polyol blend (P200H/DS with TIB Kat 220) at 23° C. The hoses, the static mixer and the nozzle were each at 23° C. The ratio of NCO to OH groups was 1.07. It was poured onto the paper.

Example 4

113.62 parts by weight of Desmodur N75 BA were reacted with a polyol mixture of 0.01 part by weight of Tib Kat 220 and 459.30 parts by weight of P200H/DS, 2.77 parts by weight of Byk 3441 and 158.31 parts by weight of butyl acetate. The isocyanate (Desmodur N75 BA) was used at 23° C., the polyol blend (P200H/DS with TIB Kat 220) at 23° C. The hoses, the static mixer and the nozzle were each at 23° C. The ratio of NCO to OH groups was 1.07. It was poured onto the paper.

Comparative Example A-3/4

The procedure was as in Examples 3 and 4, except that BYK 310 and Byk 3441 respectively were omitted. It was not possible to produce a film on the roller coating system used since the polyurethane did not lead to any wetting.

Comparative Example A-3/4

Die Distance

The procedure was as in Examples 3 and 4, except that the distance of the die was increased to 400 μm. It was not possible to produce a film on the roller coating system used since the wetting was very irregular.

Comparative Example B-9

The raw materials used were not degassed separately. 50.0 g of Desmophen® C2201 and 0.05 g of Irganox® 1076 were weighed into a polypropylene cup, mixed in a Speedmixer at 3000 revolutions per minute for a period of 1 minute and then preheated to 60° C. After the Irganox® 1076 stabilizer had dissolved completely, 0.01 g of DBTDL was added and this mixture was homogenized once again at 3000 revolutions per minute for a period of 1 min. 10.79 g of Desmodur® N 3300 were weighed into this homogeneous mixture and this mixture was again mixed in a Speedmixer at 3000 revolutions per minute for a duration of 1 minute.

The reaction mixture, which was still liquid, was used to manually coat films of wet film thickness 1 mm onto glass panes using a coating bar. After production, all films were cured at 100° C. in a drying cabinet for a duration of 1 h. After curing, the films were easily removable by hand from the glass pane.

At 1 minute, the pot life of the mixture was too short to be able to use the mixture in a roll-to-roll process. Nor is the one-component mode of operation suitable, since the mixture solidifies in the application system after a few minutes prior to application in the roll-to-roll process, and so continuous coating is impossible. The drying time of one hour was also much too long. A glass pane is an inflexible carrier unsuitable as a release film in a roll-to-roll process.

In addition, the dielectric constant was only 4.6 and the elongation at break only 175%.

Comparative Example B-10

The raw materials used were not degassed separately. 50.0 g of Desmophen® C2200 and 0.05 g of Irganox® 1076 were weighed into a polypropylene cup, mixed in a Speedmixer at 3000 revolutions per minute for a period of 1 minute and then preheated to 60° C. After the Irganox® 1076 stabilizer had dissolved completely, 0.15 g of Desmorapid SO® was added and this mixture was homogenized once again at 3000 revolutions per minute for a period of 1 min. 11.48 g of Desmodur® N 100 were weighed into this homogeneous mixture and this mixture was again mixed in a Speedmixer at 3000 revolutions per minute for a duration of 1 minute.

The reaction mixture, which was still liquid, was used to manually coat films of wet film thickness 1 mm onto glass panes using a coating bar. After production, all films were cured at 100° C. in a drying cabinet for a duration of 1 h. After curing, the films were easily removable by hand from the glass pane.

At 1 minute, the pot life of the mixture was too short to be able to use the mixture in a roll-to-roll process. Nor is the one-component mode of operation suitable, since the mixture solidifies in the application system after a few minutes prior to application in the roll-to-roll process, and so continuous coating is impossible. The drying time of one hour was also much too long. A glass pane is an inflexible carrier unsuitable as a release film in a roll-to-roll process.

| Example | Volume resistivity [ohm cm] | Dielectric strength [V/μm] | Modulus of elasticity [MPa] |
|---|---|---|---|
| 9 | 1.435E+14 | 69.4 | 2.22 |
| 10 | 9.10E+13 | 72.4 | 1.99 |

Comparative Example C-5

The raw materials used were not degassed separately. 29.412 g of Desmodur® XP 2599 and 50.0 g of Desmophen® C 2200 were mixed with an amount of 0.045 g of Desmorapid® SO and 0.05 g of Irganox® 1076 in a polypropylene cup in a Speedmixer at 3000 revolutions per minute for a duration of 1 minute. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

At 1 minute, the pot life of the mixture was too short to be able to use the mixture in a roll-to-roll process. Nor is the one-component mode of operation suitable, since the mixture solidifies in the application system after a few minutes prior to application in the roll-to-roll process, and so continuous coating is impossible. A glass pane is an inflexible carrier unsuitable as a release film in a roll-to-roll process.

Electrical resistivity is too low.

Comparative Example C-6

The raw materials used were not degassed separately. 50.0 g of Desmophen® C 1200 were mixed with 0.05 g of Irganox® 1076, 9.188 g of Desmodur® N100 and an amount of 0.013 g of DBTDL in a polypropylene cup in a Speedmixer at 3000 revolutions per minute for a duration of 1 minute. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

At 1 minute, the pot life of the mixture was too short to be able to use the mixture in a roll-to-roll process. Nor is the one-component mode of operation suitable, since the mixture solidifies in the application system after a few minutes prior to application in the roll-to-roll process, and so continuous coating is impossible. A glass pane is an inflexible carrier unsuitable as a release film in a roll-to-roll process.

Elongation at break is too low at 125%; resistivity is likewise too low.

Comparative Example C-7

The raw materials used were not degassed separately. 309.5 g of the prepolymer from Example 1 were preheated to 60° C., weighed together with 10.0 g of TMP, 0.2 g of DBTDL and 0.01 g of Irganox® 1076 into a polypropylene cup and mixed in a Speedmixer at 3000 revolutions per minute for a duration of 1 minute.

The reaction mixture, which was still liquid, was used to manually coat films of wet film thickness 1 mm onto glass panes using a coating bar. After production, all films were cured at 100° C. in a drying cabinet for a duration of 1 h. After curing, the films were easily removable by hand from the glass pane.

At 1 minute, the pot life of the mixture was too short to be able to use the mixture in a roll-to-roll process. Nor is the one-component mode of operation suitable, since the mixture solidifies in the application system after a few minutes prior to application in the roll-to-roll process, and so continuous coating is impossible. The drying time of one hour was also much too long. A glass pane is an inflexible carrier unsuitable as a release film in a roll-to-roll process.

Electrical resistivity is too low.

Comparative Example 1a

Produced according to DE 10 2007 005 960, Example 1.

All liquid raw materials were carefully degassed under argon in a three-stage process; the carbon black was sieved through a 125 μm sieve. 10 g of Terathane 650 (INVISTA GmbH, D-65795 Hatterheim, poly-THF of molar mass Mn=650) are weighed together with 0.596 g of carbon black (Ketjenblack EC 300 J, product from Akzo Nobel AG) into a 60 ml disposable mixing vessel (APM-Technika AG, Cat. No. 1033152) and mixed in a Speedmixer (product from APM-Technika AG, CH-9435 Heerbrugg; distributor in Germany: Hauschild; model: DAC 150 FVZ) at 3000 rpm for 3 min to give a homogeneous paste. Subsequently, 0.005 g of dibutyltin dilaurate (Metacure® T-12, Air Products and Chemicals, Inc.) and 6.06 g of the isocyanate N3300 (the isocyanurate trimer of HDI; product from Bayer MaterialScience AG) are weighed into this and the mixture is mixed at 3000 rpm for 1 min in a Speedmixer. The reaction paste was poured onto a glass pane and drawn out with a coating bar of wet film thickness 500 μm to give a homogeneous film of solids content 2%. The film was subsequently heat-treated at 80° C. for 16 h.

The dielectric strength was determined to be 5 V/μm and the resistivity to be 2.00E03 ohm m. Both values are below requirements.

Comparative Example 1b

Produced according to DE 10 2007 005 960, Example 2.

All liquid raw materials were carefully degassed under argon in a three-stage process; the carbon black was sieved through a 125 μm sieve. 10 g of Arcol PPG 2000 (DMC-catalysed polypropylene oxide of mean molar mass Mn=2000; product from Bayer MaterialScience AG) are weighed together with 0.636 g of carbon black (Ketjenblack EC 300) into a 60 ml disposable mixing vessel and mixed in a Speedmixer at 3000 rpm for 3 min to give a homogeneous paste. Subsequently, 0.005 g of dibutyltin dilaurate and 7.13 g of the isocyanate Desmodur XP 2599 (allophanate prepolymer of the formula I where n=30 to 38, again using Arcol PPG 2000 as the polyalkylene oxide; product from Bayer MaterialScience AG) are weighed into this mixture and mixed in at 3000 rpm for 1 min in a Speedmixer. The reaction paste was poured onto a glass pane and drawn out with a coating bar of wet film thickness 500 µm to give a homogeneous film of solids content 2%. The film was subsequently heat-treated at 80° C. for 16 h.

The dielectric strength was determined to be 30 V/µm and the resistivity to be 1.67E08 ohm m. Both values are below requirements.

Comparative Example 2

Produced according to WO 2010049079, Example 1.
200 g of PolyTHF® 2000 and 50 g of PolyTHF® 1000 were heated to 80° C. in a standard stirring apparatus. Subsequently, at 80° C., a mixture of 66.72 g of isophorone diisocyanate and 520 g of methyl ethyl ketone was added, and the mixture was stirred at reflux (about 8 hours) until the theoretical NCO value had been attained. The finished prepolymer was cooled to 20° C. and then a solution of 25.2 g of methylenebis(4-aminocyclohexane) and 519.5 g of isopropanol was metered in within 30 min. Then stirring was continued until IR spectroscopy was no longer able to detect any free isocyanate groups.

The resulting clear solution had the following properties:
Solids content: 25%
Viscosity (viscometer, 23° C.): 4600 mPas The solution used to produce a polymer layer in each case was not degassed separately. The required amount of 100 g of the solution was weighed into a polypropylene cup (PP cup). The reaction mixture, which was still liquid, was used to manually coat layers of wet film thickness 1 mm onto glass panes using a coating bar. After production, all layers were dried at 30° C. in a drying cabinet overnight and then subjected to further heat treatment at 120° C. for 5 min. After the heat treatment, the layers were easily removable by hand as films from the glass pane.

Creep was determined to be 42.5%. This is well above the requirements of <10%.

All other examples in WO 2010049079 according to the reported data for the films are outside the requirements, or the material is not a polyurethane.

Comparative Example 3a

Produced according to EP 2280034, Comparative Example 1.

The raw materials used were not degassed separately. 10 g of Desmodur XP 2599 were mixed with 28.1 g of a trifunctional polypropylene glycol-polyethylene glycol polyether having a number-average molecular weight of 6000 g/mol and a proportion of ethylene oxide units of 0% by weight and with 0.028 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 13.5%, electrical resistivity to be 3.54E08 ohm m and dielectric strength to be 20.4 V/µm. This is outside the requirements.

Comparative Example 3b

Produced according to EP 2 280 034, Comparative Example 2.

The raw materials used were not degassed separately. 10 g of Desmodur XP 2599 were mixed with 28.06 g of a difunctional polypropylene glycol-polyethylene glycol polyether having a number-average molecular weight of 4000 g/mol and a proportion of ethylene oxide units of 0% by weight and with 0.028 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 13.9%, electrical resistivity to be 1.91E08 ohm m and dielectric strength to be 21.3 V/µm. This is outside the requirements.

Comparative Example 3c

Produced according to EP 2 280 034, Comparative Example 3.

The raw materials used were not degassed separately. 3.91 g of Desmodur N3300 were mixed with 39.88 g of a difunctional polypropylene glycol-polyethylene glycol polyether having a number-average molecular weight of 4000 g/mol and a proportion of ethylene oxide units of 0% by weight and with 0.12 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 30.3%, electrical resistivity to be 4.77E08 ohm m and dielectric strength to be 25 V/µm. This is outside the requirements.

Comparative Example 3d

Produced according to EP 2 280 034, Comparative Example 4.

The raw materials used were not degassed separately. 3.58 g of Desmodur XP2410 were mixed with 39.88 g of a trifunctional polypropylene glycol-polyethylene glycol polyether having a number-average molecular weight of 6000 g/mol and a proportion of ethylene oxide units of 0% by weight and with 0.12 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Electrical resistivity was determined to be 5.08E08 ohm m and dielectric strength to be 25.4 V/μm. This is outside the requirements.

Comparative Example 3e

Produced according to EP 2 280 034, Comparative Example 5.

The raw materials used were not degassed separately. 3.91 g of Desmodur N3300 were mixed with 39.88 g of a trifunctional polypropylene glycol-polyethylene glycol polyether having a number-average molecular weight of 6000 g/mol and a proportion of ethylene oxide units of 0% by weight and with 0.12 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Electrical resistivity was determined to be 1.50E09 ohm m and dielectric strength to be 33.4 V/μm. This is outside the requirements.

Comparative Example 3f

Produced according to EP 2 280 034, Example 1.

The raw materials used were not degassed separately. 3.0 g of Desmodur N 3300 (isocyanurate based on HDI) and 7.0 g of the prepolymer from Example 1 were weighed into a polypropylene cup and mixed together in a Speedmixer at 3000 revolutions per minute for 1 minute. This mixture was then mixed with 41.2 g of a difunctional polypropylene glycol-polyethylene glycol polyether having a number-average molecular weight of 4000 g/mol and a proportion of ethylene oxide units of 0% by weight and with an amount of 0.041 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 21.3%, electrical resistivity to be 1.74E09 ohm m and dielectric strength to be 24.6 V/μm. This is outside the requirements.

Comparative Example 3g

Produced according to EP 2 280 034, Example 2.

The raw materials used were not degassed separately. 3.0 g of Desmodur N 3300 (isocyanurate based on HDI) and 7.0 g of the prepolymer from Example 1 were weighed into a polypropylene cup and mixed together in a Speedmixer at 3000 revolutions per minute for 1 minute. This mixture was then mixed with 41.2 g of a trifunctional polypropylene glycol-polyethylene glycol polyether having a number-average molecular weight of 6000 g/mol and a proportion of ethylene oxide units of 0% by weight and with an amount of 0.041 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 24.4%, electrical resistivity to be 1.42E09 ohm m and dielectric strength to be 18.2 V/μm. This is outside the requirements.

Comparative Example 3h

Produced according to EP 2 280 034, Example 3.

The raw materials used were not degassed separately. 4.0 g of Desmodur N 3300 (isocyanurate based on HDI) and 16.0 g of the prepolymer from Example 1 were weighed into a polypropylene cup and mixed together in a Speedmixer at 3000 revolutions per minute for 1 minute. This mixture was then mixed with 66.16 g of a difunctional polypropylene glycol-polyethylene glycol polyether having a number-average molecular weight of 4000 g/mol and a proportion of ethylene oxide units of 20% by weight, based on the polyether, and with an amount of 0.132 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Electrical resistivity was determined to be 5.10E08 ohm m and dielectric strength to be 35.5 V/μm. This is outside the requirements.

Comparative Example 3i

Produced according to EP 2 280 034, Example 4.

1300 g of hexamethylene 1,6-diisocyanate (HDI), 1.3 g of benzoyl chloride and 1.3 g of methyl para-toluenesulphonate were initially charged in a 4 liter four-neck flask while stirring. Within 3 hours, at 80° C., 1456 g of a difunctional polypropylene glycol polyether having a number-average molecular weight of 2000 g/mol were added thereto and the mixture was stirred at the same temperature for a further 1 hour. Subsequently, by thin film distillation at 130° C. and 0.1 Torr, the excess HDI was distilled off; 1 g of chloropropionic acid was present in the receiver flask. The resulting NCO prepolymer had an NCO content of 3.23% and a viscosity of 1650 mPas (25° C.).

The raw materials used were not degassed separately. 9.0 g of the above-described prepolymer were weighed together with 1.0 g of Desmodur N 3300 into a polypropylene cup and mixed together in a Speedmixer at 3000 revolutions per minute for 1 minute. This mixture was then mixed with 24.22 g of a difunctional polypropylene glycol-polyethylene glycol polyether having a number-average molecular weight of 4000 g/mol and a proportion of ethylene oxide units of 20% by weight, based on the polyether, and with an amount of 0.048 g of DBTDL in a polypropylene cup in a Speedmixer at 3000 revolutions per minute for a duration of 3 minutes. The reaction mixture, which was still liquid, was used to manually coat films of wet film thickness 1 mm onto glass panes using a coating bar. After production, all films were dried at 80° C. in a drying cabinet overnight and then subjected to further heat treatment at 120° C. for 5 min. After the heat treatment, the films were easily removable by hand from the glass pane.

Creep was determined to be 19.9%, electrical resistivity to be 9.93E08 ohm m and dielectric strength to be 38.6 V/µm. This is outside the requirements.

Comparative Example 4a

Produced according to DE 10 2007 059858, Example 4.
82.5 g of PolyTHF® 1000, 308 g of PolyTHF® 2000 and 10.0 g of 2-ethylhexanol were heated to 70° C. Subsequently, at 70° C., a mixture of 41.4 g of hexamethylene diisocyanate and 54.7 g of isophorone diisocyanate was added within 5 min, and the mixture was stirred at 110-125° C. until the NCO value had gone below the theoretical value. The finished prepolymer was dissolved with 880 g of acetone at 50° C. and then a solution of 3.8 g of ethylenediamine, 4.6 g of isophoronediamine, 26.3 g of diaminosulphonate and 138 g of water was metered in within 10 min. The mixture was stirred for a further 15 min. Thereafter, dispersion was effected by addition of 364 g of water within 10 min. Subsequently, the solvent was removed by distillation under reduced pressure, and a storage-stable dispersion was obtained.
Particle size (LKS): 181 nm
Viscosity: 1300 mPas The required amount of 100 g of the dispersion was weighed into a PP cup. The reaction mixture, which was still liquid, was used to manually coat films of wet film thickness 1 mm onto glass panes using a coating bar. After production, all films were dried at 30° C. in a drying cabinet overnight and then subjected to further heat treatment at 120° C. for 5 min. After the heat treatment, the films were easily removable by hand from the glass pane.

Creep was determined to be 48.3% and dielectric strength to be 21 V/µm, which are thus outside the requirements made.

Comparative Example 4b

Produced according to DE 10 2007 059858, Example 5.
450 g of PolyTHF® 1000 and 2100 g of PolyTHF® 2000 were heated to 70° C. Subsequently, at 70° C., a mixture of 225.8 g of hexamethylene diisocyanate and 298.4 g of isophorone diisocyanate was added within 5 min, and the mixture was stirred at 100-115° C. until the NCO value had gone below the theoretical value. The finished prepolymer was dissolved with 5460 g of acetone at 50° C. and then a solution of 29.5 g of ethylenediamine, 143.2 g of diaminosulphonate and 610 g of water was metered in within 10 min. The mixture was stirred for a further 15 min. Thereafter, dispersion was effected by addition of 1880 g of water within 10 min. Subsequently, the solvent was removed by distillation under reduced pressure, and a storage-stable dispersion was obtained.
Solids content: 56%
Particle size (LKS): 276 nm
Viscosity: 1000 mPas The required amount of 100 g of the dispersion was weighed into a PP cup. The reaction mixture, which was still liquid, was used to manually coat films of wet film thickness 1 mm onto glass panes using a coating bar. After production, all films were dried at 30° C. in a drying cabinet overnight and then subjected to further heat treatment at 120° C. for 5 min. After the heat treatment, the films were easily removable by hand from the glass pane.

Creep was determined to be 48.3% and dielectric strength to be 23 V/µm, which are thus outside the requirements made.

Assessment of the Examples and Comparative Examples

The electrical resistivity and dielectric strength of the films were determined. The results are shown for the Comparative Examples and Inventive Examples in Table 1 below.

| Example # | Tensile strength [MPa] | Elongation at break [%] | PE 50% [%] | Creep [%] | DC 0.01 Hz | DS [V/µm] | Rb [m] |
|---|---|---|---|---|---|---|---|
| 1 | 7.2 | 268 | 0.75 | 4.8 | 6.7 | 110.6 | 2.82E+12 |
| 2 | 6.5 | 266 | 0.65 | 1.36 | 7.8 | 83.4 | 2.08E+12 |
| 3 | 8.9 | 305 | 0.06 | 7.97 | 5.9 | 82.5 | 2.07E+12 |
| 4 | 8.5 | 278 | 1.04 | 5.8 | 8.5 | 99.1 | 2.41E+12 |
| Comp. Ex.: 1a | nd | nd | nd | nd | <4 | 5 | 2.00E+03 |
| Comp. Ex.: 1b | nd | nd | nd | nd | 700 | 30 | 1.67E+08 |
| Comp. Ex.: 2 | 33.5 | 540 | 6.26 | 42.5 | 21.5 | 61.3 | 4.52E+10 |
| Comp. Ex.: 3a | 0.327 | 107 | 0.32 | 13.5 | 25.4 | 20.4 | 3.54E+08 |
| Comp. Ex.: 3b | 0.178 | 125 | 0.45 | 13.9 | 16.6 | 21.3 | 1.91E+08 |
| Comp. Ex.: 3c | 0.28 | 262 | 1.71 | 30.3 | 8.6 | 25 | 4.77E+08 |
| Comp. Ex.: 3d | 0.63 | 85 | 0.65 | 10.5 | 28.9 | 25.4 | 5.08E+08 |
| Comp. Ex.: 3e | 0.7 | 110 | −0.24 | 6.2 | 10.8 | 33.4 | 1.50E+09 |
| Comp. Ex.: 3f | 0.143 | 364 | 1.84 | 21.3 | 8.7 | 24.6 | 1.74E+09 |
| Comp. Ex.: 3g | 0.392 | 251 | 1.76 | 20.4 | 11.6 | 18.2 | 1.42E+09 |
| Comp. Ex.: 3h | 0.927 | 211 | 1.29 | 4.7 | 2800 | 35.5 | 5.10E+08 |
| Comp. Ex.: 3i | 1.085 | 516 | 2.48 | 19.9 | 1796 | 38.6 | 9.93E+08 |
| Comp. Ex.: 4a | 33.5 | 650 | 4.98 | 48.3 | 21.5 | 21 | 4.90E+11 |
| Comp. Ex.: 4b | 42.8 | 640 | 4.98 | 48.3 | 657 | 23 | 5.00E+11 |

It has been found that the inventive films give distinct advantages over those of the prior art. The inventive films were also produced on an industrial scale in a roll-to-roll coating process. The comparative examples are laboratory batches.

A particular advantage of the inventive films is the combination of very high electrical resistivity and high dielectric strength. The inventive films can especially be used for production of electromechanical transducers with particularly good efficiencies.

The invention claimed is:
1. A process for producing a dielectric polyurethane film, in which at least the following steps are performed continuously:
   I) producing a mixture comprising
      a) a compound containing isocyanate groups and having a content of isocyanate groups of >10% by weight and ≤50% by weight, b) a compound containing isocyanate-reactive groups and having an OH number of ≥20 and ≤150, c) at least one solvent having a vapour pressure at 20° C. of >0.1 mbar and <200 mbar, d) at least one wetting additive, where the sum of the number-average functionalities of the isocyanate groups and of the isocyanate-reactive groups in the compounds a) and b) is ≥2.6 and ≤6, II) immediately after production of the mixture, applying the mixture to a carrier in the form of a wet film, III) curing the wet film to form the polyurethane film and IV) separating the polyurethane film from the carrier, wherein the wet film is cured in step III) by conducting the wet film through a first drying section having a temperature of ≥40° C. and ≤120° C., wherein the total residence time of the wet film in the drying section is ≥10 seconds and ≤60 minutes, wherein the dielectric polyurethane film has an electrical resistivity >1.5E12 ohm m determined according to ASTM D 257 and wherein the creep at 10% deformation after 30 min to DIN 53 441 is <30%.

2. The process according to claim 1, wherein the mixture is applied to the carrier in step II) by means of a die.

3. The process according to claim 2, wherein the distance of the die from the carrier is less than three times the thickness of the wet film.

4. The process according to claim 1, wherein a wet film having a thickness of 10 to 300 μM is produced in step II).

5. The process according to claim 1, wherein the wet film after the first drying section is additionally conducted through a second drying section having a temperature of ≥60° C. and ≤130° C.

6. The process according to claim 5, wherein the wet film after the second drying section is additionally conducted through a third drying section having a temperature of ≥110° C. and ≤180° C.

7. The process according to claim 1, wherein the solvent has a vapour pressure at 20° C. of >0.2 mbar and <150 mbar.

8. The process according to claim 1, wherein the compound a) has a number-average functionality of isocyanate groups of ≥2.0 and ≤4.

9. The process according to claim 1, wherein the compound a) comprises an aliphatic polyisocyanate.

10. The process according to claim 1, wherein the compound b) has a number-average functionality of isocyanate-reactive groups of ≥2.0 and ≤4.

11. The process according to claim 1, wherein the compound b) comprises a diol.

12. The process according to claim 1, wherein the carrier comprises plastic or paper.

13. The process according to claim 1, wherein the tensile strength of the dielectric polyurethane film is >2 MPa to DIN 53 504.

14. The process according to claim 1, wherein the dielectric strength of the dielectric polyurethane film is >40 V/μm to ASTM D 149-97a.

15. A dielectric polyurethane film obtained by the process according to claim 1.

16. A process for producing an electromechanical transducer comprising
producing a dielectric polyurethane film by a process according to claim 1 in a first step, and disposing an electrode on each of the opposite sides of the dielectric polyurethane film in a second step.

17. An electromechanical transducer obtained by the process according to claim 16.

* * * * *